United States Patent
Kuo et al.

(10) Patent No.: US 7,855,383 B2
(45) Date of Patent: Dec. 21, 2010

(54) SEMICONDUCTOR DEVICE AND ITS MANUFACTURING METHOD

(75) Inventors: Ching-Yeh Kuo, Padeh (TW); Tsung-Chi Cheng, Padeh (TW); Yu-Chou Lee, Padeh (TW); Yea-Chung Shih, Padeh (TW); Wen-Kuang Tsao, Padeh (TW); Hsiang-Hsien Chung, Padeh (TW); Hung-Yi Hsu, Padeh (TW); Jui-Chung Chang, Padeh (TW)

(73) Assignee: ChungHwa Picture Tubes, Ltd., Padeh (TW)

( * ) Notice: Subject to any disclaimer, the term of this patent is extended or adjusted under 35 U.S.C. 154(b) by 548 days.

(21) Appl. No.: 11/979,667

(22) Filed: Nov. 7, 2007

(65) Prior Publication Data

US 2008/0061327 A1    Mar. 13, 2008

Related U.S. Application Data

(62) Division of application No. 11/070,216, filed on Mar. 3, 2005, now abandoned.

(51) Int. Cl.
 *H01L 29/786* (2006.01)

(52) U.S. Cl. .................. 257/72; 257/288; 257/E29.242
(58) Field of Classification Search .................. 257/72, 257/288
See application file for complete search history.

(56) References Cited

U.S. PATENT DOCUMENTS

| 5,311,040 | A  | * | 5/1994  | Hiramatsu et al. | ............ 257/57 |
| 6,297,161 | B1 | * | 10/2001 | Sah | ............ 438/706 |
| 6,545,356 | B2 |   | 4/2003  | Akram et al. | |
| 6,586,335 | B1 |   | 7/2003  | Sakata et al. | |

* cited by examiner

*Primary Examiner*—Evan Pert
(74) *Attorney, Agent, or Firm*—Bacon & Thomas, PLLC

(57) ABSTRACT

A semiconductor device and its manufacturing method are disclosed. The nitrogen flow is gradually changed to form a semiconductor device with a gate or a source/drain having a nitrified gradient layer structure. Different extents of nitrification inside the nitrified gradient layer structure provide protection and buffering to prevent the undercut after etching due to different materials in the multilayer structure or the interface effect.

20 Claims, 5 Drawing Sheets

SEMICONDUCTOR DEVICE AND ITS MANUFACTURING METHOD

This application is a divisional application of U.S. application Ser. No. 11/070,216 filed Mar. 3, 2005, now abandoned.

BACKGROUND OF THE INVENTION

1. Field of the Invention

The invention relates to a semiconductor device and the method of manufacturing the same. In particular, the invention relates to a semiconductor device with a nitrified gradient layer structure and the method of manufacturing the same.

2. Description of the Related Art

During the manufacturing process of semiconductor devices, one often has to define many fine patterns. A primary method of forming these patterns employs the etching technology to copy the photo resist patterns generated by microlithography onto the material under it. Therefore, the etching technology plays a very important role in semiconductor processes.

The etching technology has two types: the wet etching and the dry etching. The biggest advantage of drying etching is its anisotropic etching, which can render a more precise etching profile. However, the dry etching equipment is more expensive and involves a vacuum system. Thus, the maintenance fee is higher. A common substitute method is wet etching. Nonetheless, the wet etching usually has a fairly high selectivity for different materials. Aside from the crystalline direction that may affect the etching rate, the wet etching is basically an isotropic etching because chemical reactions do not have any preference in orientations. The isotropic etching means that the wet etching does not only etch in the vertical direction, it also etches in the horizontal direction. The horizontal etching will result in the so-called "undercut" phenomenon that cannot accurately transfer a pattern.

For multilayer thin film transistors (TFT's), the control of etching profile is often very difficult. If the etching rates of materials in different layers differ too much, it is very easy to result in serious undercut. For example, an ordinary gate uses the AlNd/AlNdN bi-layer structure. However, the etching rates of AlNd and AlNdN differ by a factor of 6 to 7, the undercut is thus unavoidable. Therefore, people insert barriers among layers that have very different etching rates as buffering. For example, one can use AlNd/MoN/Mo as the gate or Ti/Al/MoN/Mo as the source and drain. Nonetheless, this method requires additional target materials or devices and does not allow one-time film formation. Moreover, it is likely to have the material interface problem among the layers, rendering defects.

SUMMARY OF THE INVENTION

In view of the foregoing, the major purpose of the invention is to provide a semiconductor device and the method of manufacturing the same. The nitrogen flow is varied in the manufacturing process to form a semiconductor device with a gradient layer structure to improve the undercut situation.

Based upon the above idea, the invention provides a semiconductor device which includes a substrate and a gate with a nitrified gradient layer structure on the substrate.

The invention further provides a semiconductor device, which contains a substrate; a gate formed on the substrate; a semiconductor layer formed on the gate; a source/drain formed on the semiconductor layer and having a nitrified gradient layer structure; and a channel formed between the source and the drain.

The invention provides another semiconductor device, which contains a substrate; a gate formed on the substrate and having a nitrified gradient layer structure; a semiconductor layer formed on the gate; a source/drain formed on the semiconductor layer and having a nitrified gradient layer structure; and a channel formed between the source and the drain.

In addition, the invention provides a method of manufacturing the semiconductor device comprising the steps of: providing a substrate and gradually adjusting the procedure parameter, ex. the nitrogen flow to form a gate with a nitrified gradient layer structure on the substrate.

The invention provides another method of manufacturing the semiconductor device comprising the steps of: providing a substrate; forming a gate on the substrate; forming a semiconductor layer on the gate; gradually adjusting the procedure parameter, ex. the nitrogen flow to form a source/drain with a nitrified gradient layer structure on the semiconductor layer; and forming a channel between the source and the drain.

The invention provides yet another method of manufacturing the semiconductor device comprising the steps of: providing a substrate; gradually adjusting the nitrogen flow to form a gate with a nitrified gradient layer structure on the substrate; forming a semiconductor layer on the gate; gradually adjusting the nitrogen flow to form a source/drain with a nitrified gradient layer structure on the semiconductor layer; and forming a channel between the source and the drain.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The disclosed semiconductor device and its manufacturing method can be used in the manufacturing process of the TFT. During the film formation of the gate, source, and drain, the procedure parameter, ex. the nitrogen flow is adjusted to form the gate, source, and drain with a nitrified gradient layer structure, subsequently forming a semiconductor device. The nitrified gradient layer structure mentioned herein refers to the structure of a gradient concentration distribution in nitrogen.

First Embodiment

Figure 1:
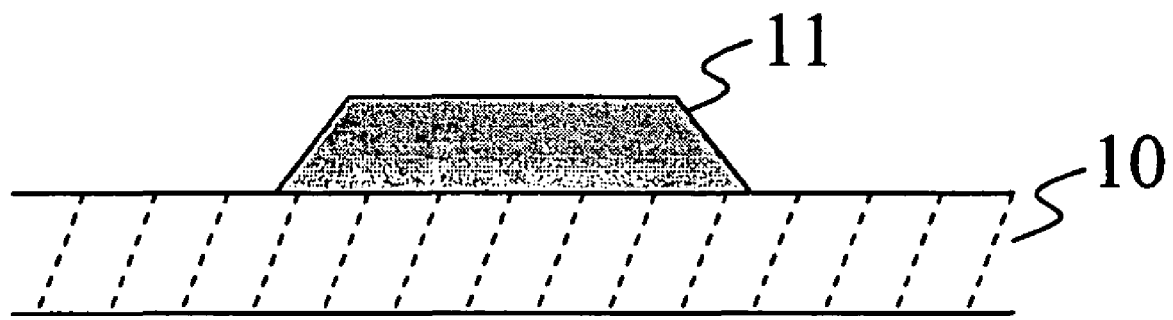
FIG. 1 is a schematic view of a semiconductor device having a gate with a nitrified gradient layer structure according to the invention.
Figure 2:
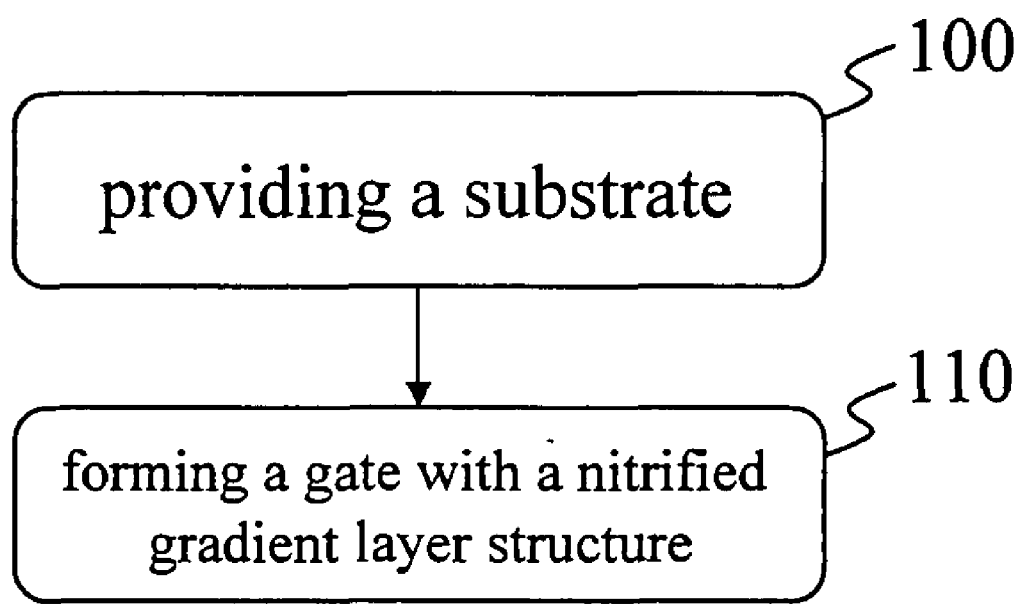
FIG. 2 is a flowchart of manufacturing a semiconductor device having a gate with a nitrified gradient layer structure according to the invention.

Please refer to FIGS. 1 and 2. The semiconductor device having a gate with a nitrified gradient layer structure and the primary manufacturing processes are described as follows:

Providing a substrate (step 100). A glass substrate 10 is provided in this embodiment.

Forming a gate with a nitrified gradient layer structure (step 110). A metal layer of AlNd is deposited on the glass substrate 10. The working gas is argon. The flow rate is kept at 100 standard cubic centimeters per minute (sccm). At the same time, nitrogen is provided with a flow rate gradually increasing from 0 sccm to 100 sccm during the deposition process. A gate 11 with a nitrified gradient layer structure is thus formed. Its thickness is about 2520 Å.

Since the flow rate of nitrogen is controlled in a steady way, the relation between the concentration of nitrogen and depth in the gate 11 is not fixed. That is, unlike the gate with a multilayer structure in the prior art, the gate 11 in the disclosed semiconductor device has different extents of nitrification in the vertical direction, increasing from the near to the far of the substrate.

Second Embodiment

Figure 3:
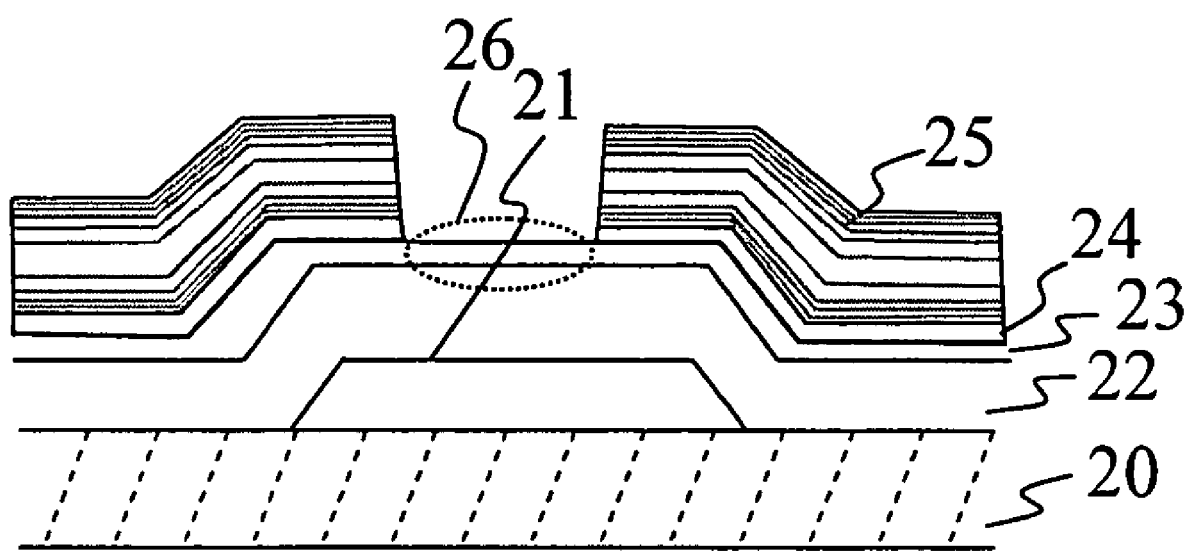
FIG. 3 is a schematic view of a semiconductor device having a source/drain with a nitrified gradient layer structure according to the invention.
Figure 4:
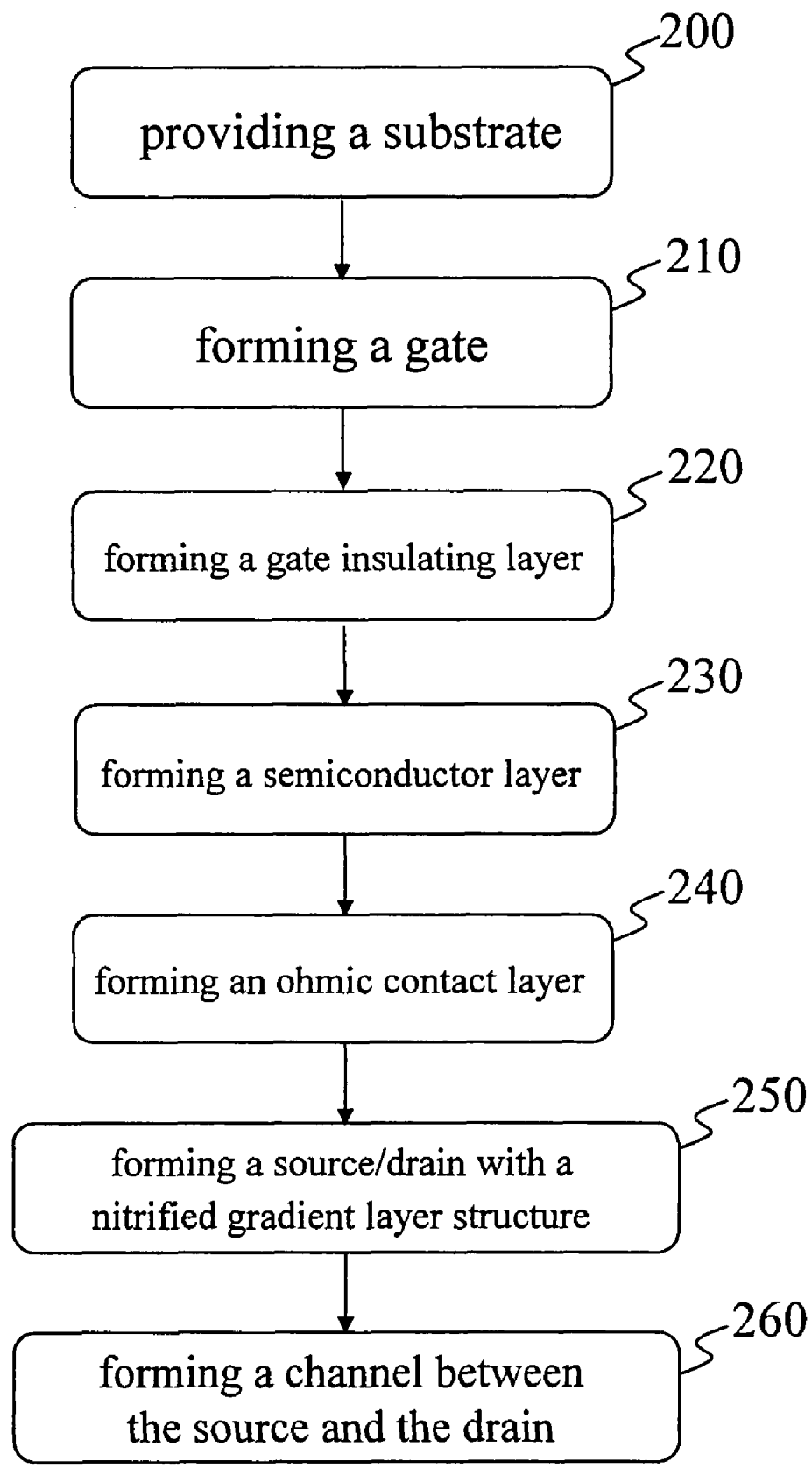
FIG. 4 is a flowchart of manufacturing a semiconductor device having a source/drain with a nitrified gradient layer structure according to the invention.

Please refer to FIGS. 3 and 4. The semiconductor device having a source/drain with a nitrified gradient layer structure and the primary manufacturing processes are described as follows:

Providing a substrate (step 200). A glass substrate 20 is provided in this embodiment.

Forming a gate (step 210). A metal layer is deposited on the glass substrate 20 as the gate 21.

Forming a gate insulating layer (step 220). SiNx is deposited on the gate 21 using the plasma enhanced chemical vapor deposition (PECVD) method to form the gate insulating layer 22.

Forming a semiconductor layer (step 230). A semiconductor layer 23 is deposited on the gate insulating layer 22 as the electron channel of the TFT.

Forming an ohmic contact layer (step 240). n+Si is deposited on the semiconductor layer 23 to form the ohmic contact layer 24.

Forming a source and a gate with a nitrified gradient layer structure (step 250). A metal layer of AlNd is deposited on the ohm contact layer 24. The working gas is argon. The flow rate is kept at 100 sccm. At the same time, nitrogen is provided with a flow rate gradually decreasing from 100 sccm to 0 sccm during the deposition process and then back to 100 sccm when the thickness of AlNd is enough, thereby forming a signal line of the source/drain 25 of the nitrified gradient layer structure. The signal line controls the transmissions of 0/1 signals. The thickness of the film is about 2840 Å.

Forming a channel between the source and the drain (step 260). Part of the ohmic contact layer 24 and part of the source/drain 25 are etched to form the channel 26, forming a TFT structure.

Since the flow rate of nitrogen is controlled in a steady way, the relation between the concentration of nitrogen and depth in the source/drain 25 is not fixed. That is, unlike the source/drain with a multilayer structure in the prior art, the source/drain 25 in the disclosed semiconductor device has different extents of nitrification in the vertical direction, the nitrification increasing from the far and the near of the substrate.

Third Embodiment

Figure 5:
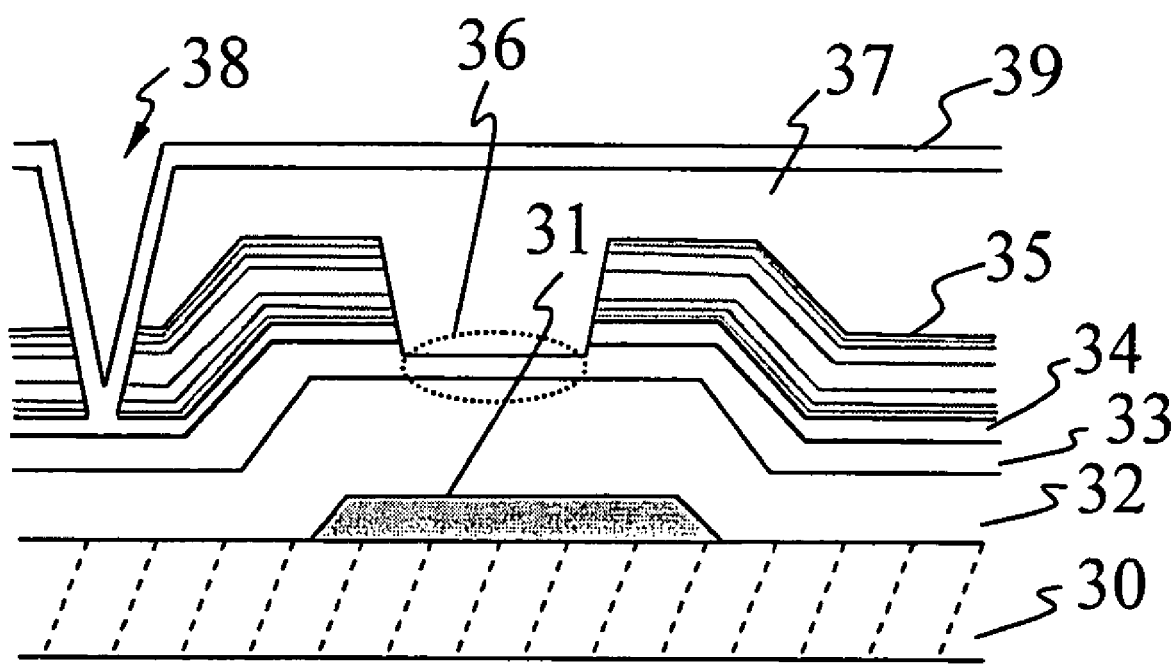
FIG. 5 is a schematic view of a semiconductor device having a gate and a source/drain with a nitrified gradient layer structure according to the invention.
Figure 6:
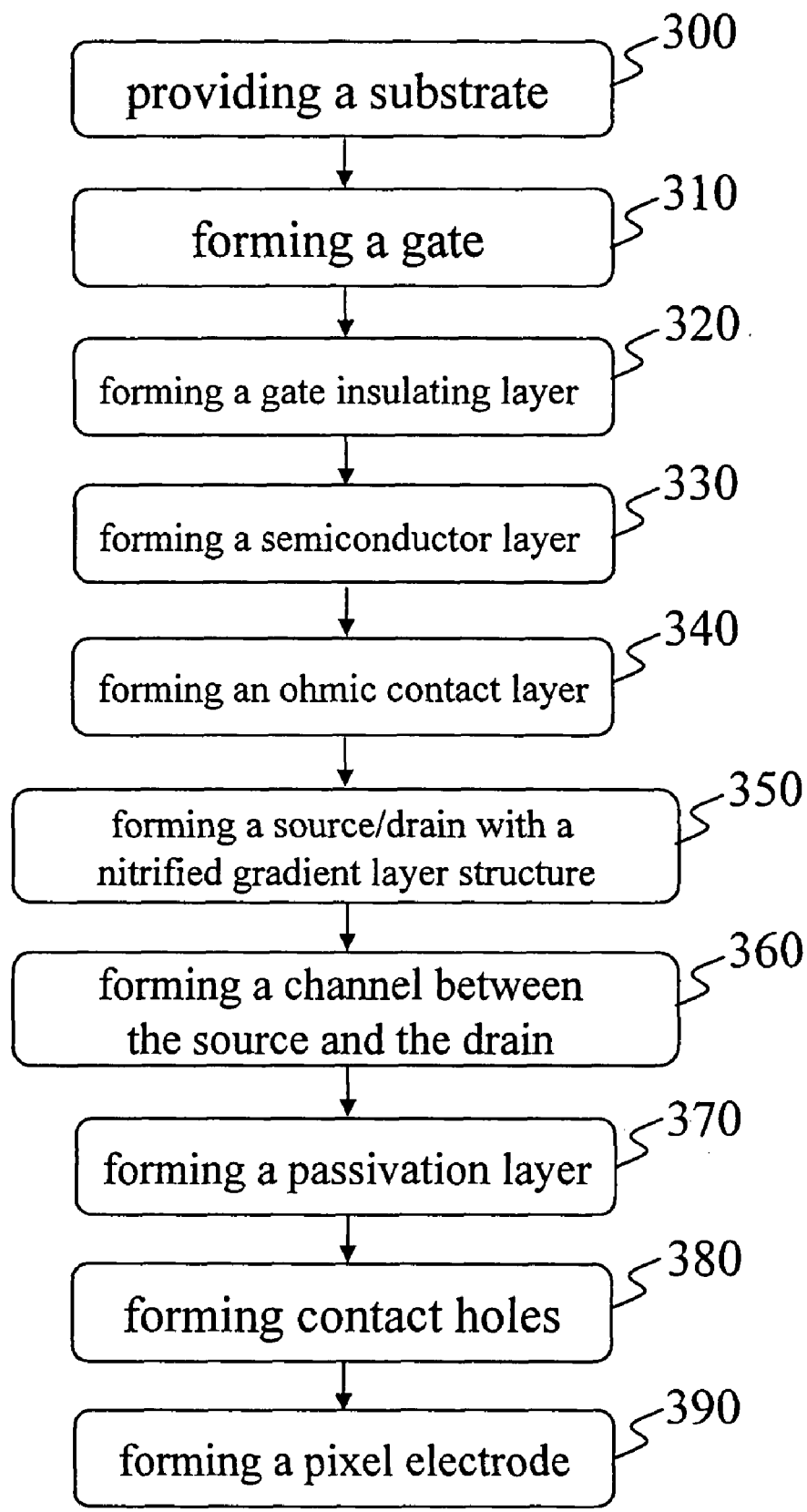
FIG. 6 is a flowchart of manufacturing a semiconductor device having a gate and a source/drain with a nitrified gradient layer structure according to the invention.

Please refer to FIGS. 5 and 6. The semiconductor device having a gate, a source/drain with a nitrified gradient layer structure and the primary manufacturing processes are described as follows:

Providing a substrate (step 300). A glass substrate 30 is provided in this embodiment.

Forming a gate (step 310). A metal layer of AlNd is deposited on the glass substrate 30. The working gas is argon. The flow rate is kept at 100 sccm. At the same time, nitrogen is provided with a flow rate gradually increasing from 0 sccm to 100 sccm during the deposition process. A gate 31 with a nitrified gradient layer structure is thus formed.

Forming a gate insulating layer (step 320). SiNx is deposited on the gate 31 using the PECVD method to form the gate insulating layer 32.

Forming a semiconductor layer (step 330). A semiconductor layer 33 is deposited on the gate insulating layer 32 as the electron channel of the TFT.

Forming an ohmic contact layer (step 340). n+Si is deposited on the semiconductor 33 to form the ohmic contact layer 34.

Forming a source and a gate with a nitrified gradient layer structure (step 350). A metal layer of AlNd is deposited on the ohm contact layer 34. The working gas is argon. The flow rate is kept at 100 sccm. At the same time, nitrogen is provided with a flow rate gradually decreasing from 100 sccm to 0 sccm during the deposition process and then back to 100 sccm when the thickness of AlNd is enough, thereby forming a signal line of the source/drain 35 of the nitrified gradient layer structure. The signal line controls the transmissions of 0/1 signals.

Forming a channel between the source and the drain (step 360). Part of the ohmic contact layer 34 and part of the source/drain 35 are etched to form the channel 36, forming a TFT structure.

Forming a passivation layer (step 370). SiNx covers the whole substrate 30 as the passivation layer 37 to avoid humidity corrosion.

Forming contact holes (step 380). Several contact holes 38 are etched on the passivation layer 37 to expose part of the source/drain 35.

Forming a pixel electrode (step 390). Finally, indium-tin-oxide (ITO) transparent metal covers the whole passivation layer 37 to form the pixel electrode 39. The pixel electrode 39 is in electrical communications with the TFT under the passivation layer 37 through the contact holes 38.

Since the flow rate of nitrogen is controlled in a steady way, the relation between the concentration of nitrogen and depth in the gate 31, the source/drain 35 is not fixed. That is, unlike the gate and the source/drain with a multilayer structure in the prior art, the gate 31, the source/drain 35 in the disclosed semiconductor device has different extents of nitrification in the vertical direction. The nitrification of the gate 31 increases from the near to the far of the substrate, while that of the source/drain 35 increases from the far and the near of the substrate.

It should be mentioned that the gate, source, and drain with a nitrified gradient layer structure in the above embodiments are made of AlNd and its nitrides. One may also use Al, Cu, Ag, Mo, Cr, Ti or their alloys and their nitrides.

In the semiconductor device with the gate, source, and drain that have a nitrified gradient layer structure, the part with the highest concentration of nitrogen has the protection function. Other parts with lower nitrification have the buffering function, thereby improving the undercut phenomenon during etching.

In summary, the disclosed semiconductor device and the method of manufacturing the same control the nitrogen flow during the film formation of the gate, the source, and the drain, thereby forms the nitrified gradient layer structure. This can reduce the undercut phenomenon. Moreover, this structure can be formed at once in a vacuum chamber. Not only is the manufacturing process simple, the material interface problem is also avoided. The invention does not require any additional device or target material. Therefore, the equipment costs do not increase.

Certain variations would be apparent to those skilled in the art, which variations are considered within the spirit and scope of the claimed invention.

What is claimed is:

1. A semiconductor device, comprising:
   a substrate;
   a gate formed on said substrate;
   a semiconductor layer formed on said gate;
   a source/drain formed on said semiconductor layer respectively, wherein a concentration of nitrogen in said source and said drain has a gradient distribution and increases in portions of said source and drain farthest and nearest said substrate; and
   a channel formed between said source and said drain.

2. The semiconductor device of claim 1, wherein said substrate is a glass substrate.

3. The semiconductor device of claim 1, wherein a concentration of nitrogen in said gate has a gradient distribution.

4. The semiconductor device of claim 1, wherein a concentration of nitrogen in said gate increases from nearest to farthest from said substrate.

5. The semiconductor device of claim 1, wherein said gate comprises a metal and nitrides of metal.

6. The semiconductor device of claim 5, wherein said metal is selected from the group consisting of Al, Cu, Ag, Mo, Cr, Ti, and their alloys, and AlNd.

7. The semiconductor device of claim 1, wherein said source/drain comprises a metal and nitrides of said metal.

8. The semiconductor device of claim 7, wherein said metal is selected from the group consisting of Al, Cu, Ag, Mo, Cr, Ti, and their alloys, and AlNd.

9. The semiconductor device of claim 1 further comprising a gate insulating layer between said gate and said semiconductor layer.

10. The semiconductor device of claim 1 further comprising an ohmic contact layer formed on said semiconductor layer.

11. The semiconductor device of claim 1 further comprising a passivation layer formed on said substrate covering said gate, said semiconductor layer, and said source/drain.

12. The semiconductor device of claim 11 further comprising a contact hole formed in said passivation layer.

13. The semiconductor device of claim 11 further comprising a pixel electrode formed on said passivation layer.

14. A semiconductor device, comprising:
    a substrate;
    a gate formed on said substrate, wherein a concentration of nitrogen in said gate has a gradient distribution;
    a semiconductor layer formed on said gate;
    a source/drain formed on said semiconductor layer respectively, wherein a concentration of nitrogen in said source and said drain has a gradient distribution; and
    a channel formed between said source and said drain.

15. The semiconductor device of claim 14, wherein said gate comprises a metal and nitrides of metal.

16. The semiconductor device of claim 14, wherein said source/drain comprises a metal and nitrides of said metal.

17. The semiconductor device of claim 14 further comprising a gate insulating layer between said gate and said semiconductor layer.

18. The semiconductor device of claim 14 further comprising an ohmic contact layer formed on said semiconductor layer.

19. The semiconductor device of claim 14 further comprising a passivation layer formed on said substrate covering said gate, said semiconductor layer, and said source/drain.

20. The semiconductor device of claim 19 further comprising a contact hole formed in said passivation layer and a pixel electrode formed on said passivation layer.

* * * * *